United States Patent [19]

Doerrwaechter

[11] Patent Number: 5,097,247
[45] Date of Patent: Mar. 17, 1992

[54] HEAT ACTUATED FUSE APPARATUS WITH SOLDER LINK

[75] Inventor: Bernhard E. Doerrwaechter, Oconomowoc, Wis.

[73] Assignee: North American Philips Corporation, New York, N.Y.

[21] Appl. No.: 709,683

[22] Filed: Jun. 3, 1991

[51] Int. Cl.⁵ ............... H01H 37/76; H01H 85/04
[52] U.S. Cl. ................. 337/405; 337/297; 337/403; 337/232; 29/623
[58] Field of Search ............ 337/401–417, 337/232, 296, 297; 29/623

[56] References Cited

U.S. PATENT DOCUMENTS

| | | | |
|---|---|---|---|
| 4,494,104 | 1/1985 | Holmes | 337/403 |
| 4,533,896 | 8/1985 | Belopolsky | 337/232 |
| 4,626,818 | 12/1986 | Hilgers | 337/166 |
| 4,652,848 | 3/1987 | Hundrieser | 337/405 |

FOREIGN PATENT DOCUMENTS

| | | |
|---|---|---|
| 0143493 | 6/1985 | European Pat. Off. |
| 1184056 | 3/1970 | United Kingdom |
| 2145295 | 3/1985 | United Kingdom |

*Primary Examiner*—Harold Broome
*Attorney, Agent, or Firm*—Robert J. Kraus

[57] ABSTRACT

An apparatus for protecting circuitry includes a heat actuated fuse which opens at a predetermined temperature and a resistive device disposed proximate the fuse for heating the fuse in response to an electrical current passed through the device. The fuse includes first and second electrodes bridged by a solder link which melts at the predetermined temperature and retreats to the electrodes. A quantity of flux-containing material is disposed on the link to promote rapid and complete retreat of the solder when the fuse is actuated.

20 Claims, 4 Drawing Sheets

HEAT ACTUATED FUSE APPARATUS WITH SOLDER LINK

BACKGROUND OF THE INVENTION

1. Field of the Invention

The invention relates to a heat actuated fuse and to an apparatus which incorporates such a fuse for protecting electrical circuitry. The invention is particularly useful for interrupting current flow to thick film circuits and components.

2. Description of Related Art

A heat actuated fuse has an important advantage over the more common current actuated fuse. Although both types of fuses ultimately open at a predetermined temperature, a heat actuated fuse can be positioned such that it responds directly to the temperature of a protected component or circuit, and temperature is often a better indicator of imminent failure than current. Examples of known heat actuated fuses are described in Great Britain Patent 2,145,295A and U.S. Pat. No. 4,533,896.

Great Britain Patent 2,145,295A discloses a thermal fuse disposed on a substrate nearby a resistor, which is also disposed on the substrate. The fuse includes a pair of electrodes defining a gap between them, a gold fuse link extending across the gap to electrically interconnect the electrodes, and a film of solder overlying the gold fuse link and overlapping at least one of the electrodes. When the temperature of the substrate exceeds the melting point of the solder film, the solder is intended to melt, dissolve the gold fuse link, and then retreat from the gap with the dissolved gold to sever the electrical connection between the electrodes.

This fuse is relatively simple to manufacture, but its reliability depends on thorough dissolution of the gold fuse link by the process of leaching. This is a gradual process which begins after the film of solder melts. The gold fuse link then dissolves and is attracted to tin in the solder. The speed of opening of this fuse is relatively slow, and the solder material is limited to a composition containing tin or whatever material will effectively leach the gold or other metal chosen for the fuse link.

U.S. Pat. No. 4,533,896 discloses a fuse for protecting thick film devices deposited on a substrate. The fuse includes two terminal blocks, each including a hole, which are mounted to the substrate in close proximity to each other and with the holes aligned. An electrically conductive fusible link (e.g. solder) is suspended across a space between the terminal blocks and extends into the holes to complete an electrical circuit. The holes are larger than necessary to accept the fusible link so that, when the fusible link melts because of excessive heat, molten material from the fusible link will be drawn into the holes.

Manufacture of this fuse is a complicated and labor intensive process. Manufacture requires boring of holes in the terminal blocks, coating the inner surfaces of the holes and the end surfaces of the terminal blocks with solder, assembling the blocks and fusible link, and then positioning and soldering the assembled fuse onto electrodes provided on the substrate.

SUMMARY OF THE INVENTION

It is an object of the invention to provide a heat actuated fuse which opens reliably and quickly.

It is another object of the invention to provide such a fuse which can be manufactured simply to open at any predetermined temperature within a wide range.

It is yet another object of the invention to provide apparatus incorporating one or more of such fuses for protecting circuitry including one or more electrical elements.

In accordance with the invention, a heat actuated fuse for opening at a predetermined temperature comprises an arrangement of materials which can be deposited on an electrically insulating substrate by commonly used printed circuit fabrication techniques. First and second electrodes of electrically conductive material are disposed on the substrate in a spaced apart relationship to define a gap between the electrodes. A layer of a first solder material, having a melting temperature which is higher than the actuation temperature of the fuse, is disposed on at least one of the electrodes. A conductive link disposed on at least a portion of each electrode and on the substrate extends across the gap to provide an electrical connection between the electrodes.

The conductive link comprises a predetermined quantity of a second solder material, which is in contact with the solder layers on the electrodes. The second solder material has a melting temperature which substantially corresponds to the actuation temperature of the fuse, and the predetermined quantity of this material is containable on the first and second electrodes.

Because different solder materials having a large range of respective melting temperatures are readily available, the fuse can be constructed to open at any temperature within a correspondingly large range. A quantity of flux-containing material is disposed in contact with the conductive link to effect a rapid and reliable flow of the second solder material to the first and second electrodes, when the fuse is heated to its actuation temperature.

In a preferred embodiment of the invention, a resistive device is disposed proximate the fuse for effecting heating of the fuse in response to an electrical current passed through the device. Various advantages can be achieved by utilizing such means, independent of the protected circuit element(s), for heating the fuse. For example, by electrically connecting and physically disposing the resistive device such that it is subjected to the same electrical and environmental conditions as the circuitry protected by the fuse, freedom is achieved in the placement of the circuit element(s). Also, types of circuits elements which cannot, without destruction, produce sufficient heat to melt the fusible link may be protected.

DESCRIPTION OF THE PREFERRED EMBODIMENTS

Figure 1:
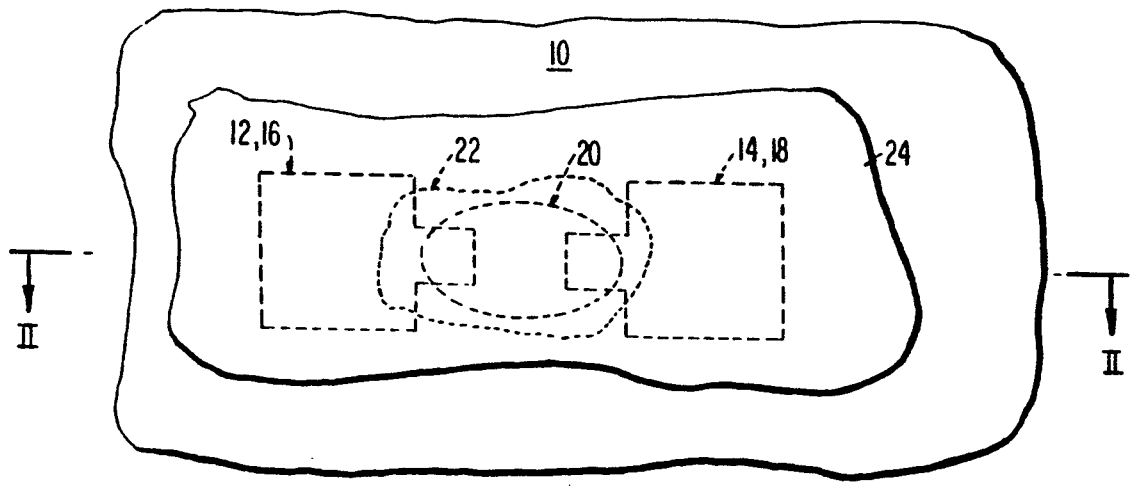
FIG. 1 is a top view of a first embodiment of a heat actuated fuse in accordance with the invention.
Figure 2:
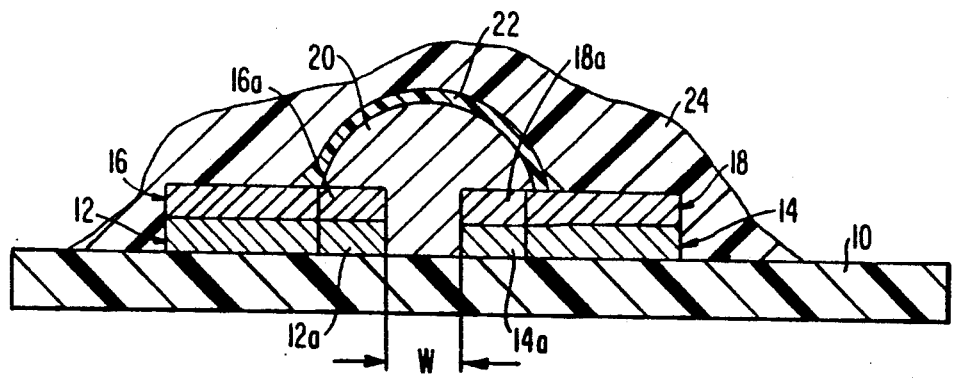
FIG. 2 is a sectional view of the fuse taken along line II—II of FIG. 1.
Figure 3A:
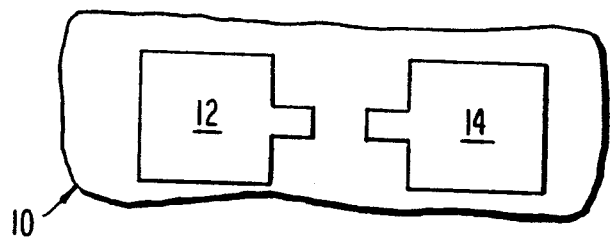
FIGS. 3a to 3h illustrate successive steps in manufacturing the fuse of FIG. 1.
Figure 3B:
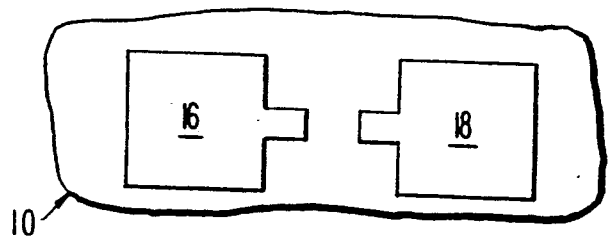
Figure 3C:
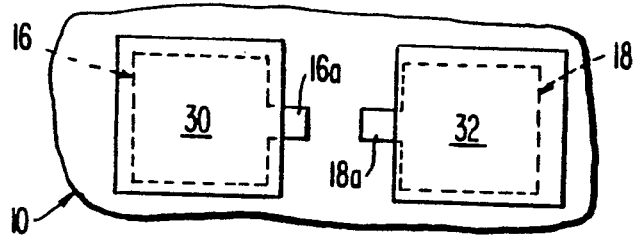
Figure 3D:
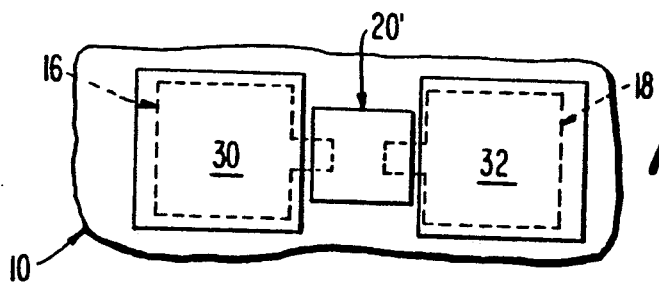
Figure 3E:
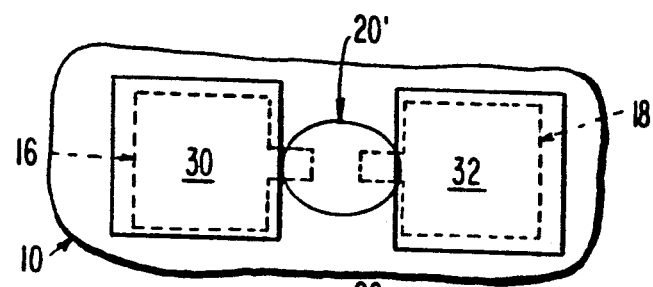
Figure 3F:
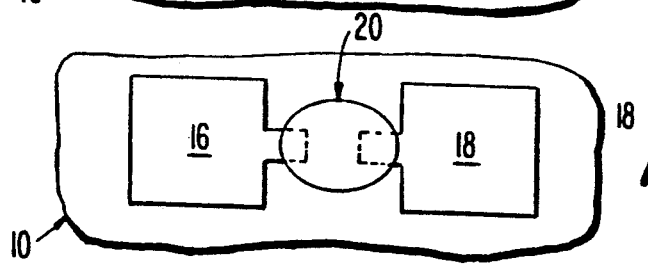
Figure 3G:
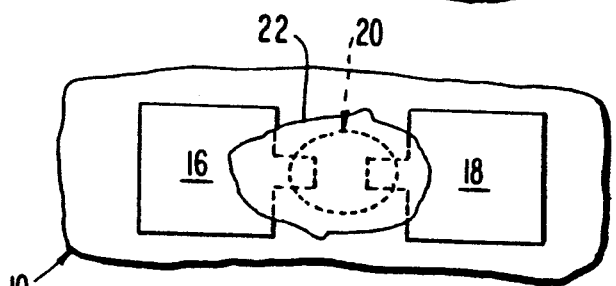
Figure 3H:
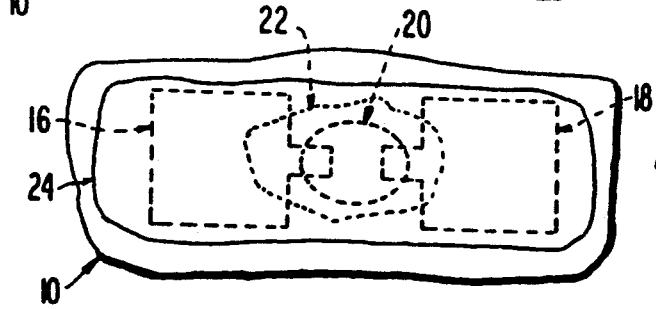

FIGS. 1 and 2 illustrate in top view and cross section, respectively, a preferred embodiment of a heat actuated fuse constructed in accordance with the invention. The fuse is formed by a combination of deposits supported on a portion of a substrate 10 of an electrically insulating material. The particular substrate material must be compatible with the fuse fabrication method employed and must have heat conductivity characteristics compatible with the manner of actuating the fuse. For example, if the fuse and an actuating device are provided on the same substrate, and the fuse senses the temperature of the component primarily by means of heat conduction through the substrate, a material having substantial thermal conductivity, such as alumina, should be chosen. Alternatively, if lower heat conductivity is satisfactory for a particular application, a material such as phenolic may be used.

The substrate 10 supports two thick film metallic electrodes 12, 14 having respective projecting tab portions 12a, material, such as a palladium-silver alloy, and are spaced apart such that a gap of width w exists between the tab portions. The width w of the gap determines the volume of solder which must flow onto the electrodes to open the fuse. In a practical embodiment of the fuse, each of the electrodes 12, 14 has a main portion measuring 0.100×0.100 in., a respective tab portion measuring 0.020×0.040 in., and the gap has a width w=0.015 to 0.020 in. These dimensions may be adjusted from one embodiment to another to fit the fuse in the amount of available space.

Disposed on the electrodes 12, 14 are respective layers 16, 18 of a first solder material having a melting temperature which is substantially higher than the actuation temperature of the fuse. For example, a 96.5Sn/3.5Ag solder having a melting temperature of 221° C. was used for a fuse having an actuation L temperature of 179° C. The layers 16, 18 have respective portions 16a, 18a disposed on the corresponding tab portions 12a, 14a of the electrodes.

A conductive link 20 of a second solder material extends across the gap, electrically connecting the electrodes 12, 14. The conductive link is disposed in globular form covering the tab portions 12a, 14a, the respective overlying solder layer portions 16a, 18a, and the surface area of the substrate lying between and immediately adjacent to the tab portions. The second solder material has a melting temperature substantially corresponding to the actuation temperature of the fuse. For example, a 62Sn/36Pb/2Ag, solder having a melting temperature of 179° C. was used for the above mentioned fuse having the same actuation temperature.

A small quantity of flux-containing material 22 covers the solder link 20. Alternatively, this material may be disposed on the substrate immediately adjacent the link or as a dab on some substantial portion of the link. The primary requirement is that the material 22 be in physical contact with the link.

Suitable flux-containing materials include solder paste and simple flux itself. Either of these materials will, when the fuse link is heated to its melting temperature, promote the flow of the melted solder link 20 from the gap and onto the solder layers 16, 18 covering the electrodes 12, 14. Solder paste is a convenient material, since it may also be used to form the link. However, flux is a less expensive material and may be used in a smaller quantity. Not only does the use of flux offer a cost advantage, but also it lessens the total volume of solder material which must flow from the gap during opening of the fuse, thereby improving reliability of opening of the fuse.

The volumes of the solder forming the conductive link 20 and of the flux-containing material in contact with the link are determined by a combination of factors. For example, the combined volumes should be containable on the electrodes 12 and 14 after melting of the solder link. Also, the cross-sectional area of the conductive link 20 should be sufficiently large to limit fuse resistance to whatever maximum value is allowable for the circuit in which the fuse is connected. Further, the length of the conductive link 20 should be sufficient to extend across the width w of the gap and to make good electrical contact with the electrodes 12, 14 and substantial physical contact with the solder layers 16, 18.

A protective covering 24 of a material such as latex or silicon rubber may be provided over at least the flux-containing material 22 to prevent damage to or deterioration of this material. The protective covering should be of an electrically insulating material and should be flexible to facilitate flow of the solder link 20 and flux-containing material 22 onto the electrodes upon opening of the fuse. The protective covering shields the flux-containing material 22 from potentially damaging process steps performed subsequent to making of the fuse and provides protection against removal of the material 22 during handling. Covering 24 also contains the solder when it melts during opening of the fuse and ensures that the melted solder does not come into contact with other components that might be mounted on the substrate. Advantageously, the covering 24 may be provided over the entire exposed surface of the fuse, as is illustrated in FIGS. 1 and 2.

The process steps involved in the manufacture of a typical heat actuated fuse in accordance with the invention is illustrated sequentially in FIGS. 3a-3h and described in the following corresponding paragraphs a-h:

a. A layer of palladium silver, thick film ink is screen printed on a 96% (by weight) alumina substrate 10 and fired to form each of the electrodes 12, 14 having a thickness of about 12 to 25 microns.

b. A layer of 96.5Sn/3.5Ag solder paste is screen printed over each of the electrodes and then heated to its melting temperature by infrared or other available means to form solder layers 16, 18 having a thickness of about 75 to 150 microns. After these layers are formed, any flux residue is cleaned away by washing the substrate with a suitable solvent.

c. Layers 30 and 32 of solder resist material are screen printed over the respective layers 16, 18, except for substantial areas of the tab portions 16a, 18a. The resist material will prevent all but these areas of the tab portions of layers 16, 18 from taking solder in the next step.

d. A layer 20' of solder paste is screen printed over the areas of the tab portions 16a, 18a which are not covered with the solder resist material and over the adjacent area of the substrate. Type 62Sn/36Pb/2Ag solder paste worked well in a practical embodiment of the fuse. The layer 20' is printed to a height and volume which effects formation of a bridge between the tab portions.

e. Layer 20' is then heated by infrared or other means to a temperature which is above the melting point of layer 20' but below the melting point of solder layers 16, 18. After melting, layer 20' flows to form the globular solder link 20.

f. The layers 16, 18 are uncovered by removing the solder resist material printed in step c. The solder resist material is removed by cleaning. For example, the substrate can be washed with a suitable solvent (such as water) for the type of resist material used. Any flux residue, from the melting of layer 20' in step e, is cleaned from the substrate and the solder link 20 by this rinsing step, or by an additional rinsing step if a different solvent is required.

g. One or more drops of flux material 22 is deposited by a dispenser on the solder fuse link 20. The amount of flux material should be sufficient to contact a substantial area of the link, and may cover the entire fuse link.

h. The protective layer 24 of latex or silicon rubber is deposited by a dispenser over the entire fuse and the surrounding surface area of the substrate 10 to a thickness of about 0.005 to 0.010 in.

Figure 4:
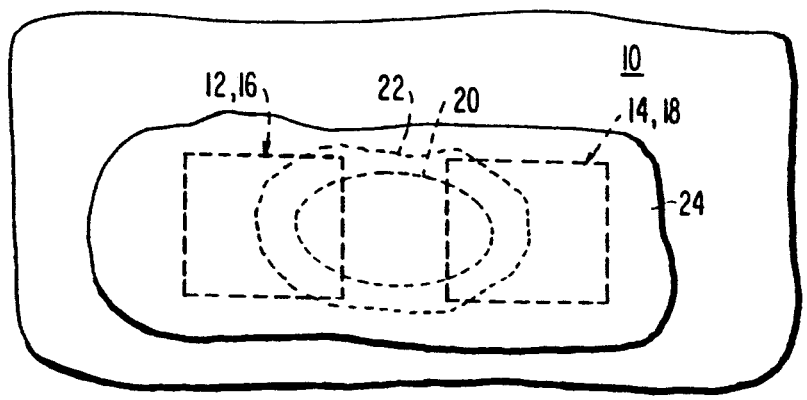
FIG. 4 is a top view of a second embodiment of a heat actuated fuse in accordance with the invention.

FIG. 4 illustrates an alternative embodiment of a heat actuated fuse constructed in accordance with the invention. This embodiment is substantially identical to the embodiment of FIG. 1, except that the electrodes 12, 14 and the overlying solder layers 16, 18 do not include tab portions. Rather, the solder link 20 bridging the gap between the electrodes is disposed on inwardly extending portions of the electrodes. A fuse of this type can be made to occupy less space than that of the FIG. 1 embodiment. However, less space will also be available for holding the melted solder link after actuation of the fuse.

Figure 5:
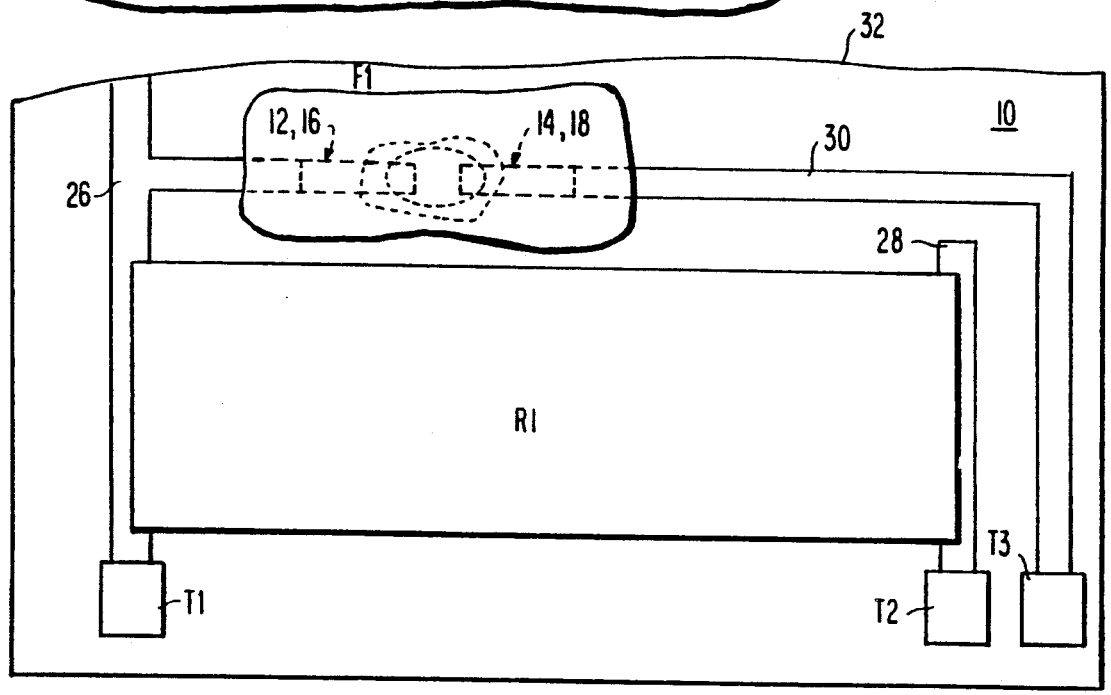
FIG. 5 is a top view of a circuit protection apparatus incorporating the fuse of FIG. 4.
Figure 6:
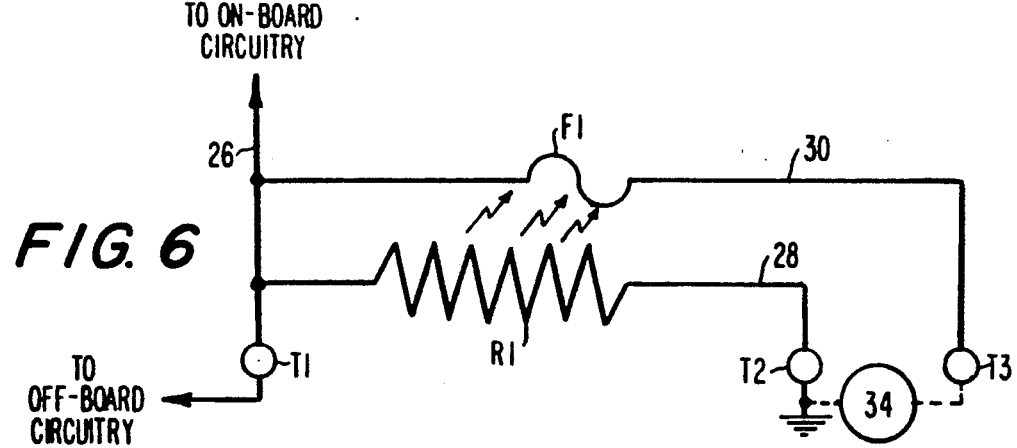
FIG. 6 is a schematic illustration of the circuit protection apparatus of FIG. 5.

FIGS. 5 and 6 illustrate a practical circuit protection apparatus in accordance with the invention. This apparatus comprises a circuit board including the substrate 10 supporting a heat actuated fuse F1 constructed in accordance with the invention, a thick film resistor R1, and conductive tracks 26, 28 and 30. In this illustrated embodiment, the substrate should be of a material having a substantial thermal conductivity, such as alumina. The resistor and conductive tracks are deposited on the substrate in accordance with conventional printed circuit fabrication techniques. Only a portion of the circuit board is illustrated in FIG. 5, and additional electrical elements such as circuit components and/or electrical terminals may be disposed on the remainder of the board located beyond the illustrated broken edge 32.

Conductive track 26 begins at an end thereof which is formed into an electrical terminal T1, and forms a conductive path connecting this terminal to one end of resistor R1 and to electrode 12 of fuse F1. Track 26 also forms a conductive path leading onto the non-illustrated portion of the circuit board for connection to one or more of the electrical elements disposed thereon. Similarly, conductive tracks 28 and 30 begin at respective ends thereof, forming terminal T2 and T3, and form conductive paths connecting these terminals to an opposite end of resistor R1 and to electrode 14 of fuse F1.

Manufacturing processes for connecting the conductive tracks 26 and 28 to respective ends of the resistor R1 are well known in the art. With regard to the process for connecting the conductive tracks 26 and 30 to the respective electrodes 12 and 14 of the fuse F1, this may be done conveniently by simultaneously forming these electrodes as integral extensions of the respective tracks. This is illustrated in FIG. 5, with solder layers 16, 18 being disposed on these integral extensions which form the electrodes 12, 14. Alternatively, these tracks and electrodes may be conductively joined by means such as a conductive epoxy, a wire connection, or by overlapping one conductive layer onto another.

By appropriately connecting the conductive track 26 and/or the terminals T1, T2 and/or T3 to other electrical elements, the protective circuit apparatus can be utilized in a variety of circuit configurations. For example, in a practical embodiment which is illustrated schematically in FIG. 6, terminal T1 is connected to circuitry located off the circuit board, conductive track 26 is connected to circuitry located on the circuit board, terminal T2 is connected to ground, and terminal T3 is connected to an electrical power source 34 such as a low voltage telephone line. Both the off-board circuitry and the on-board circuitry receive their electrical energy through fuse F1 from power source 34, and thus both will be protected against damage caused by overvoltage conditions which might occur at the power source.

In the illustrated embodiment of FIG. 6, the temperature of resistor R1 is determined primarily by the voltage applied across terminals T2 and T3 by the power source 34. The resistance of resistor R1 and its placement on the substrate 10 relative to heat actuated fuse F1 are predetermined to effect heating of the fuse to its actuation temperature at a specified power source overvoltage condition. If the fuse is actuated, the electrical connection of the off-board and on-board circuitry to terminal T3 will be permanently opened, but this circuitry can be reconnected to a power source by means of terminal T1 through a substitute protective apparatus.

A variety of other embodiments of the protective circuit apparatus in accordance with the invention are also possible. For example, a plurality of the series connected resistor/fuse combinations illustrated in FIG. 5 may be disposed on a single substrate, with similar or dissimilar terminal and conductive track arrangements. Alternatively, the substrate may bear only one of such combinations, with no additional circuit elements being disposed on the substrate. As another alternative, the current passed through resistor R1 may be controlled by an independent circuit or sensory device, such as a circuit or device for sensing a critical physical or electrical characteristic of a protected circuit, motor etc.

I claim:

1. A heat actuated fuse for opening at a predetermined actuation temperature, said fuse comprising:

a. an electrically insulating substrate;

b. first and second electrodes disposed on a surface of the substrate in a spaced apart relationship to define a gap therebetween, each of said electrodes comprising a layer of electrically conductive material;

c. a layer of a first solder material disposed on each of the first and second electrodes, said first solder material having a melting temperature which is substantially higher than the predetermined actuation temperature;

d. a conductive link extending across the gap and disposed on at least a portion of each of said first and second electrodes and on the surface of the substrate between said electrodes, said conductive link comprising a predetermined quantity of a second solder material which is in contact with the layer of solder on each of the first and second electrodes, said second solder material having a melting temperature which substantially corresponds to the predetermined actuation temperature, and said predetermined quantity of said second solder material being containable on the first and second electrodes after melting; and e. a quantity of flux containing material disposed in contact with at least a portion of the conductive link.

2. A fuse as in claim 1 including a protective covering extending over at least the flux containing material.

3. A fuse as in claim 2 where the protective covering extends over the layer of flux containing material and the first and second electrodes.

4. A fuse as in claim 1 or 2 where the flux containing material consists essentially of a flux paste.

5. A fuse as in claim 1 or 2 where the flux containing material comprises a solder material containing flux.

6. A fuse as in claim 5 where the flux containing material comprises a solder paste.

7. A fuse as in claim 1 or 2 where the flux containing material extends across substantially the entire length of the conductive link.

8. A fuse as in claim 1 or 2 where the substrate comprises a ceramic material.

9. A fuse as in claim 8 where the ceramic material consists essentially of alumina.

10. A fuse as in claim 1 or 2 where the substrate comprises a phenolic material.

11. A fuse as in claim 1 or 2 where said portion of each of the first and second electrodes comprises a tab portion of the electrode projecting toward the other electrode.

12. A fuse as in claim 1 or 2 where said portion of each of the first and second electrodes comprises an inwardly extending portion of each of said electrodes.

13. An apparatus for protecting circuitry including at least one circuit element, said apparatus comprising a heat actuated fuse, which opens at a predetermined temperature, for carrying electrical current to the protected circuitry, a resistive device disposed for effecting heating of said fuse in response to an electrical current passed through said device, and means for applying said current to said resistive device, said fuse comprising:

a. an electrically insulating substrate;

b. first and second electrodes disposed on a surface of the substrate in a spaced apart relationship to define a gap therebetween, each of said electrodes comprising a layer of electrically conductive material;

c. a layer of a first solder material disposed on each of the first and second electrodes, said first solder material having a melting temperature which is substantially higher than the predetermined actuation temperature;

d. a conductive link extending across the gap and disposed on at least a portion of each of said first and second electrodes and on the surface of the substrate between said electrodes, said conductive link comprising a predetermined quantity of a second solder material which is in contact with the layer of solder on each of the first and second electrodes, said second solder material having a melting temperature which substantially corresponds to the predetermined actuation temperature, and said predetermined quantity of said second solder material being containable on the first and second electrodes after melting; and e. a quantity of flux containing material disposed in contact with at least a portion of the conductive link.

14. An apparatus as in claim 13 including a protective covering extending over at least the flux containing material.

15. An apparatus as in claim 13 or 14 where the fuse and the resistive device are disposed on the same substrate.

16. An apparatus as in claim 15 where the means for applying the current to the resistive device includes a first terminal electrically connected to a first part of the resistive device and a second terminal electrically connected to a second part of the resistive device.

17. An apparatus as in claim 16 where the first terminal is electrically connected to the first electrode of the fuse and including a third terminal electrically connected to the second electrode of the fuse.

18. An apparatus as in claim 15 where the protected circuitry is disposed on the substrate and is electrically connected to the fuse by conductive means disposed on the substrate.

19. An apparatus as in claim 15 where the resistive device is disposed proximate the fuse.

20. An apparatus as in claim 13 or 14 where the resistive device comprises a thick film resistor.

* * * * *